(12) United States Patent
Song et al.

(10) Patent No.: US 11,372,506 B1
(45) Date of Patent: Jun. 28, 2022

(54) SYSTEM AND METHOD FOR A SYSTEM-IN-PACKAGE USING EMI SHIELDING FOR CAPACITIVE TOUCH SENSING

(71) Applicant: Amazon Technologies, Inc., Seattle, WA (US)

(72) Inventors: Fubin Song, Hong Kong (CN); Chaoran Yang, Shenzhen (CN); Kun Tang, Shenzhen (CN); Xiaoman Li, Shanghai (CN); Weitian Liu, Shenzhen (CN); Zhifan Gong, Shenzhen (CN)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 17/103,684

(22) Filed: Nov. 24, 2020

(51) Int. Cl.
*G06F 3/044* (2006.01)
*G06F 3/041* (2006.01)

(52) U.S. Cl.
CPC ............ *G06F 3/044* (2013.01); *G06F 3/0416* (2013.01); *G06F 2203/04103* (2013.01); *G06F 2203/04107* (2013.01)

(58) Field of Classification Search
None
See application file for complete search history.

(56) References Cited

U.S. PATENT DOCUMENTS

| | | | |
|---|---|---|---|
| 2015/0382448 A1* | 12/2015 | Pennathur | H05K 3/303 361/679.54 |
| 2016/0113115 A1* | 4/2016 | Kwon | H01L 23/552 361/679.26 |
| 2018/0204783 A1* | 7/2018 | Han | H01L 23/552 |

* cited by examiner

*Primary Examiner* — Stephen T. Reed
(74) *Attorney, Agent, or Firm* — Eversheds Sutherland (US) LLP

(57) ABSTRACT

Systems, methods, and computer-readable media are disclosed for systems-in-packages that are encapsulated, at least partially, by a coating serving as electromagnetic interference (EMI) shielding, thereby isolating and otherwise protecting components in the systems-in-package from interference. The systems-in-packages may include one or more capacitive sensors in communication with a portion of the EMI shielding that serves as a sensing pad. In this manner, the system-in-package may benefit from EMI shielding and capacitive touch sensing capability without the complexity and increased cost of a separate capacitive touch sensor and sensing pad.

16 Claims, 8 Drawing Sheets

SYSTEM AND METHOD FOR A SYSTEM-IN-PACKAGE USING EMI SHIELDING FOR CAPACITIVE TOUCH SENSING

BACKGROUND

Electronic devices may include various components, chips and/or sensors. Systems-in-packages may provide robust protection for such components in mobile devices and wearable devices, for example. However, these components may still be susceptible to electromagnetic interference (EMI) issues such as unwanted cross-talk among RF modules in mobile devices, causing electrical performance shifts, and making the modules more susceptible to electromagnetic compatibility (EMC) failures. In typical systems-in-packages, sensors or other components that need exposure to ambient environments may not be included, as the system-in-package may be sealed in a molding compound or otherwise enclosed, thereby obstructing access to ambient environments and rendering the sensor unable to function. For example, a capacitive touch sensor for sensing a user input on a touch screen or surface typically is not within the system-in-package. Manufacturing devices with capacitive touch sensing exterior to system-in-packages architecture is both complex and costly. Accordingly, systems-in-packages with more effective and less complex EMI shielding and capacitive touch sensing is needed.

Figure 1A:
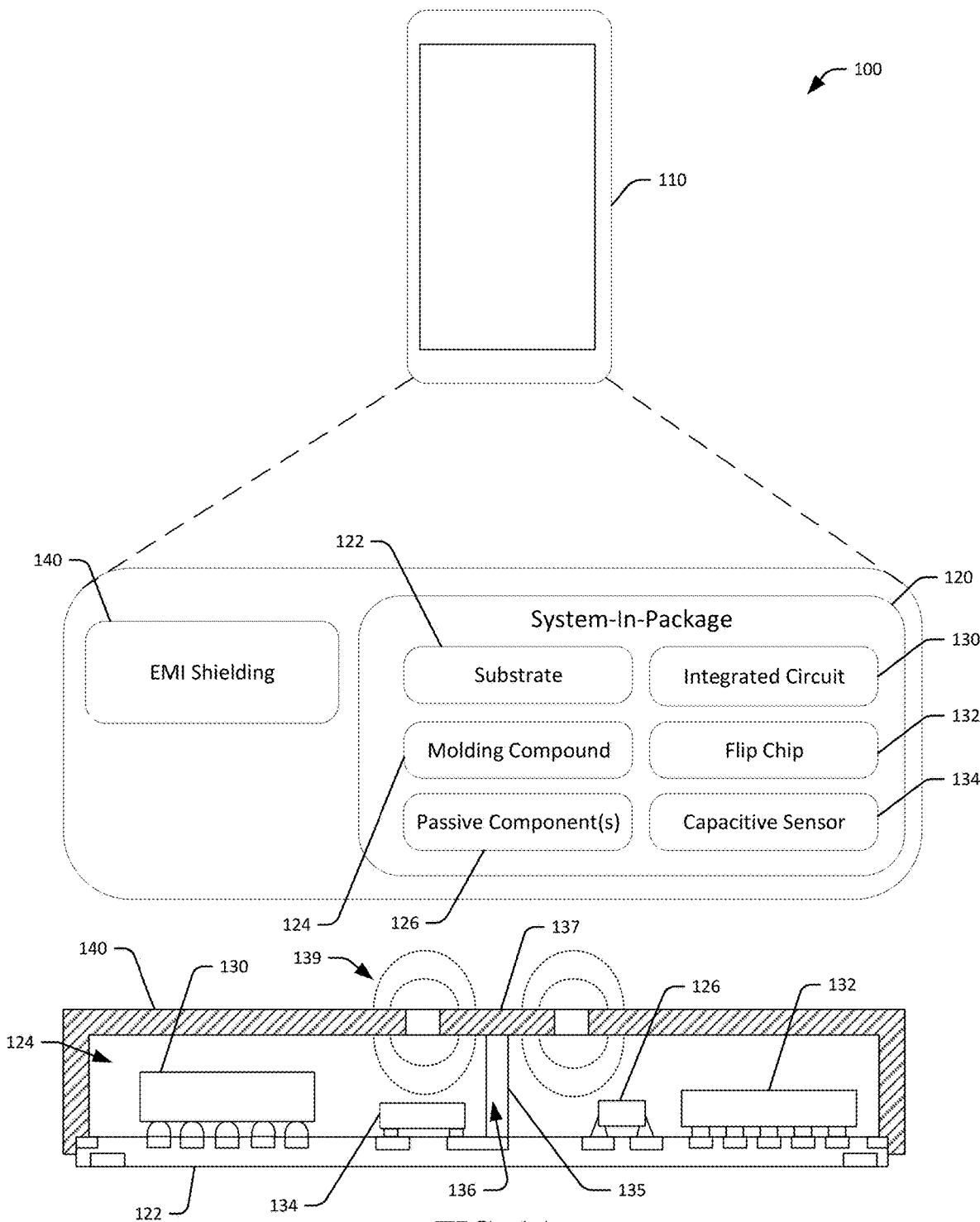
FIGS. 1A and 1B are schematic and perspective illustrations of an example use case of a system-in-package with combined EMI shielding and a capacitive sensing pad in accordance with one or more embodiments of the disclosure.

The detailed description is set forth with reference to the accompanying drawings. The drawings are provided for purposes of illustration only and merely depict example embodiments of the disclosure. The drawings are provided to facilitate understanding of the disclosure and shall not be deemed to limit the breadth, scope, or applicability of the disclosure. The use of the same reference numerals indicates similar, but not necessarily the same or identical components. Different reference numerals may be used to identify similar components. Various embodiments may utilize elements or components other than those illustrated in the drawings, and some elements and/or components may not be present in various embodiments. The use of singular terminology to describe a component or element may, depending on the context, encompass a plural number of such components or elements and vice versa.

DETAILED DESCRIPTION

Overview

Some electronic devices may include various components such as integrated circuits, flip chips and/or sensors. In addition, components such as microphones and/or cameras as well as other well-known components may be included in electronic devices. Such components may be packaged in a system-in-package (SiP) form. A system-in-package may be a number of integrated circuits and/or other components that are enclosed in one or more chip carrier packages. Systems-in-packages may provide flexibility in electronic device layout, such as by allowing for systems-in-packages to reduce device footprint. In addition, systems-in-packages may be complete functional units that can reduce device complexity.

Embodiments of the disclosure include systems-in-packages encapsulated with EMI shielding. To reduce cost and complexity, a capacitive touch sensor may be disposed within the system-in-package and may be in electrical communication with the EMI shielding which may form a sensing pad. In this manner, the capacitive touch sensor may effectively be placed within the system-in-package and any exterior sensor and sensing pad may be eliminated. The EMI shielding may isolate components and insulate components in the system-in-package from electromagnetic interface. Further the signal transfer between the sensing pad formed from the EMI shielding and the capacitive sensor may be improved. Embodiments of the disclosure may be used in any suitable electronic device, such as smartphones or other mobile devices, wearables, Internet of Things devices, and the like.

This disclosure relates to, among other things, systems, methods, computer-readable media, techniques, and methodologies for systems-in-packages having EMI shielding and integrated capacitive touch sensors. Embodiments may include systems-in-packages with molding compounds that provide vias to capacitance sensors and/or other components that may be in electrical communication with EMI shielding which may form one or more sensing pads for detecting user interaction by the capacitance touch sensor.

Figure 1B:
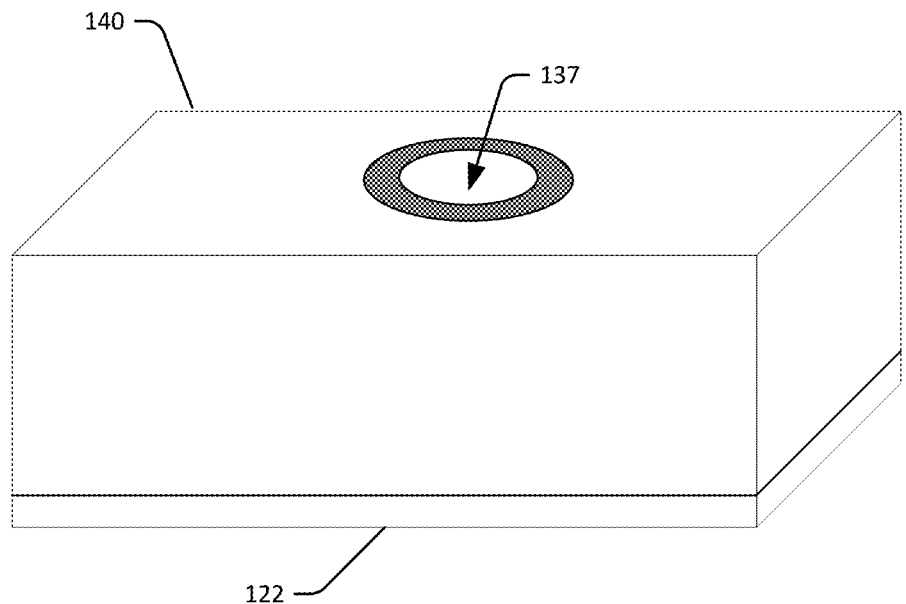

Referring to FIGS. 1A and 1B, an example use case 100 of a device 110 with a system-in-package 120 having a capacitive sensor 134 and EMI shielding 140 is depicted in accordance with one or more embodiments of the disclosure. The device 110 may be any suitable electronic device, such as a smartphone, an e-reader, a tablet, an audio or video streaming device, an Internet of Things device, a product ordering button or device, a home sensor, an aging in place device, an earphone, a speaker device, or any other well-known electronic or computing device. In the example of FIGS. 1A-B, the device 110 may be a smartphone with a display.

The device 110 may include a number of components, chips, and/or sensors. For example, the device 110 may include sensors such as capacitive touch sensors, microphone(s), temperature sensors, humidity sensors, pressure sensors, cameras, optical sensors, and/or other sensors. The sensors may be disposed in a system-in-package. The device 110 may include one or more systems-in-packages 120.

The system-in-package 120 may further include a number of other components, such as chips, including processors and/or memory, passive components, including resistors and/or capacitors, and/or other components that may be mounted on a substrate 122. In the example of FIGS. 1A-B, the substrate 122 may be a circuit board or other well-known substrate. The system-in-package 120 may include additional components, such as a molding compound 124 that at least partially surrounds the components disposed on the substrate 122, one or more passive components 126, such as resistors and/or capacitors, and one or more optional semiconductor chips, flip chip 132, and/or one or more integrated circuits 130. Integrated circuit 130 may be an integrated circuit package including one or more components in addition to an integrated circuit.

The capacitive sensor 134 may be a sensor such as a capacitive touch sensor or any other sensor that detects anything that is conductive or has a dielectric different from the air, such as a user's fingers on sensing pad 137. Sensing pad 137 may be formed from EMI shielding 140 which may be metallic (e.g., stainless steel and/or copper). In one example, EMI shielding 140 may have a tri-layer structure with an upper layer of stainless steel, a middle layer of copper, and a lower layer of stainless steel. EMI shielding 140 may be a thin metallic layer disposed over molding compound 124 via jetting, sputtering, or any other well-known approach for deposition a thin metallic layer.

The EMI shielding 140 may extend to substrate 122 and may be in electrical communication with substrate 122 to ground the EMI shielding 140 (e.g., via copper traces in substrate 122). Sensing pad 137 may be separated from EMI shielding and may be in electrical communication with capacitive sensor 134 using via 135 filled with conductive material 136 or other conductive material. An electrical field 139 may be generated between sensing pad 137 and the rest of the EMI shielding 140. A via 135 may be formed in molding compound 124 and may be filled with a conductive material 136, thereby connecting sensing pad 137 with capacitive sensor 134 such that capacitive sensor 134 is in electrical communication with sensing pad 137. It is understood that vias and any other recessed portions described herein may be filled with any conductive compound and/or conductive material. It is further understood that any other sensor for sensing a change in the electrical field generated by sensing pad 137 may be employed.

The system-in-package 120 is illustrated in a side cross-sectional view in FIG. 1A as well as a perspective view in FIG. 1B. The system-in-package 120 may include the substrate 122. The passive component 126 may be disposed on the substrate 122, along with the capacitive sensor 134, optional flip chip 132, and integrated circuit 130. A flip chip 132 may be a flip chip integrated circuit used to facilitate connections to other components of a device, such as other semiconductor components. The system-in-package 120 may further include capacitive sensor 134.

The EMI shielding 140 may both protect the components of the system-in-package 120 against electromagnetic interference (EMI) and unwanted cross-talk among the RF modules and may service as the sensing pad for the capacitive sensor. Using the EMI shielding of the system-in-package to perform the function of capacitive touch sensing, the device footprint may be reduced along with manufacturing complexity and cost. It is understood that the sensing pad 137 may be formed from the EMI shielding and further that multiple sensing pads may be formed and may electrically connect to capacitive sensor 134 using a via and a conductive material.

The above-described embodiments are merely illustrative of the scope of this disclosure and are not intended to be limiting in any way. Accordingly, variations, modifications, and equivalents of the embodiments disclosed herein are also within the scope of this disclosure.

Figure 2:
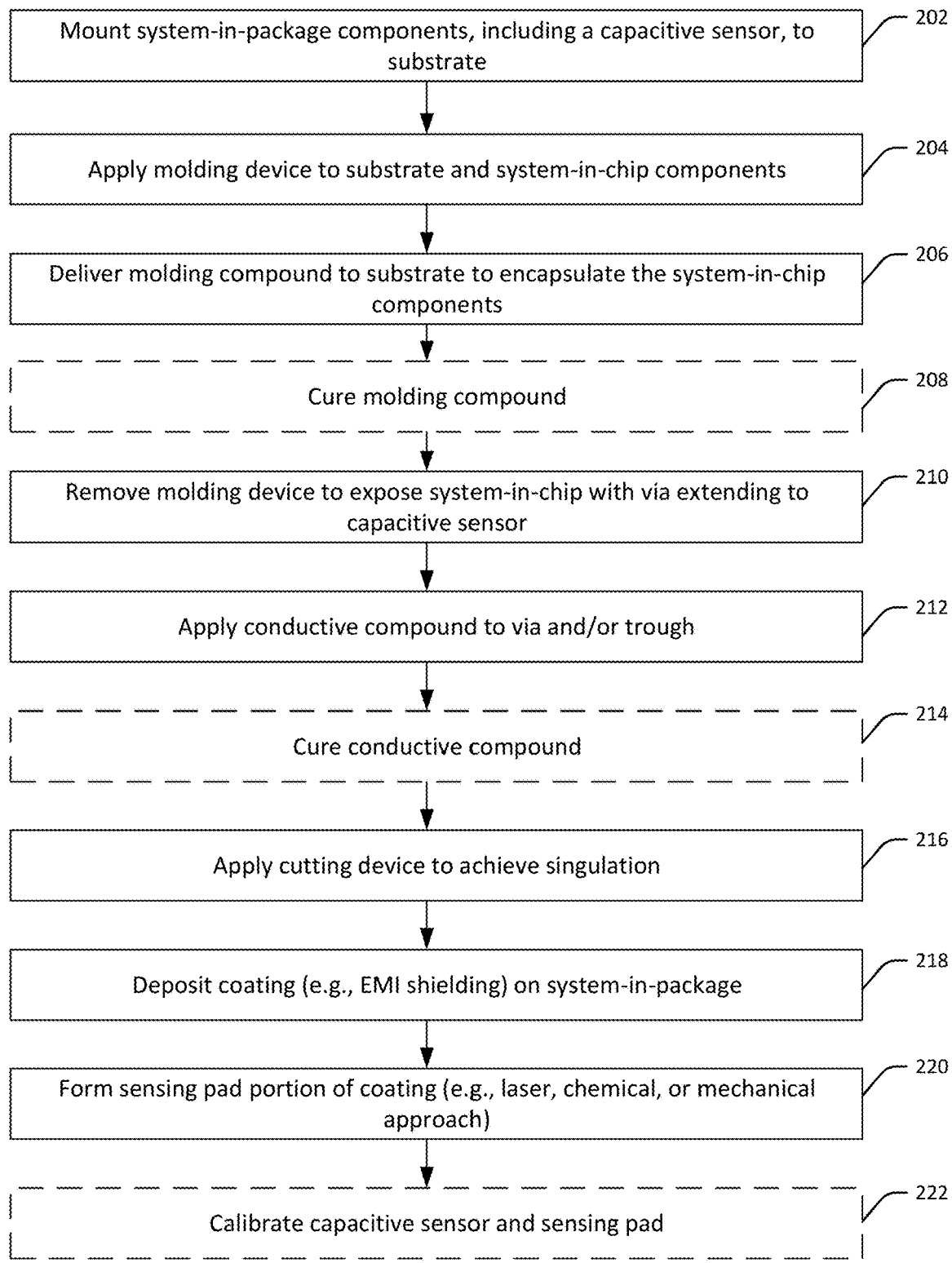
FIG. 2. is a schematic illustration of an example process flow for forming a system-in-package with combined EMI shielding and a capacitive sensing pad, in accordance with one or more example embodiments of the present disclosure.

FIG. 2 depicts an example process flow for forming a system-in-package encapsulated by EMI shielding used to protect from electromagnetic interference and further used to form a sensing pad for capacitive touch sensing in accordance with one or more embodiments of the disclosure. Other embodiments may use a different process than that illustrated in FIG. 2. Additional or fewer operations may be included.

At block 202, one or more system-in-package components may be mounted to a substrate. For example one or more of an integrated circuit, flip chip, semiconductor chip, passive component, sensors, capacitive sensors and/or other components may be arranged and mounted to a substrate using well-known techniques. In one example, components may be mounted to a printed circuit board using surface-mount technology. It is understood that fewer or additional components may be mounted to the substrate and/or may be arranged in a manner different from that described herein.

At block 204, a molding device may be applied and/or installed such that the molding device surrounds the substrate and one or more components mounted on the substrate. For example, the molding device may include a top portion and a bottom portion that may be coupled to one another in a manner that surrounds the substrate and components. The molding device may be designed to receive a molding compound. The molding device may be designed to form vias and troughs by forming recessed portions in the molding compound.

At block 206, a molding compound may be delivered to the substrate within the molding device to encapsulate the system-in-package components. This process may be a selective molding process to encapsulate components and to form one or more cavities in the molding compound. For example, the molding device may include one or more vias or troughs aligned with components or attachments on the substrate. The molding compound may be injected into the molding device.

At optional block 208, the molding device may be cured (e.g., over time and/or with heat). At block 210, the molding device may be removed, thereby removing any pillars or other obstructions included as part of the molding device to form any vias and troughs in the molding compound. A via may be a channel or void extending through the molding compound. A trough may be a void that separates or dissects a portion of the molding compound. For example, a trough may extend from one side of the substrate to another side of the substrate.

At block 212, a conductive material may be applied to the via and/or trough. The conductive material may be any well-known compound (e.g., resin or adhesive) designed to adopt the shape of the via and/or trough and having conductive properties such that a current may pass through such conductive material. For example, a via extending from the capacitive sensor from the EMI shielding may permit the capacitive sensor to detect changes in an electrical field exterior to the system-in-package despite the capacitive sensor being disposed within the system-in-package and EMI shielding. It is understood any other conductive material may be positioned with the via and/or trough. At optional block 214, the conductive material may be cured (e.g., over time and/or with heat).

At block 216, a singulation process may be performed to segment the respective systems-in-packages. In one example, the manufacturing process may involve at blocks 202-214, mounting several components to a substrate such that multiple system-in-packages may be formed at the same time. In this example, singulation may be performed by separating each system-in-package using a cutting device.

At block 218, a coating serving as EMI shielding may be deposited on the system-in-package to encapsulate the system-in-package with EMI shielding. The EMI shielding may be a coating suitable to protect components in the system-in-package against electromagnetic interference. In one example, the coating may be metallic, though it is understood that any material that shields from electromagnetic interference may be applied.

As explained above, the EMI shielding may be include more than one layer and/or more than one material. For example a tri-layer structure may be employed including an upper layer of stainless steel, a middle layer of copper, and a lower layer of stainless steel. However, it is understood that only one layer may be used and/or any other material with electromagnetic interference properties may be used. The coating may be deposited using well-known techniques for depositing thin metallic layers. For example, the coating may be deposited using sputtering and/or jetting. It is understood that where the EMI shielding includes multiple layers, the layers may be deposited using the same process or different processes.

At block 220, a sensing pad portion of coating forming EMI shielding may be formed. In one example, a laser may be used to form a channel or otherwise remove portions of EMI shielding such that a portion of EMI shielding remains deposited on the molding compound but is entirely disconnected from the rest of the EMI shielding that is in electrical communication with and grounded by the substrate. The detached portion of coating may form the sensing pad for sensing touch using the capacitive sensor.

The channel and/or removed portions may alternatively be formed using chemical etching or any other mechanical or milling approach, for example. Various pattern designs may result in different electrical fields generated between the sensing pad and the remaining EMI shielding. It is understood that multiple sensing pad portions may be created. Where multiple sensing pad portions are formed, one portion may perform as a transmitting electrode and one portion may perform as a receiving electrode. Various sensing pad designs are described below with respect to FIGS. 5A-5D.

At optional block 222 the capacitive sensor and/or the sensing pad may be calibrated. It is understood that differences in EMI shielding thickness (e.g., coating thickness), EMI shielding materials, sensing pad sizing, shape and positioning, and via architecture (e.g., channel sizes and lengths) may result in different electrical fields detected by the sensing pad. To account for these differences, the capacitive sensor and the sensing pad may need to be calibrated.

Figure 3:
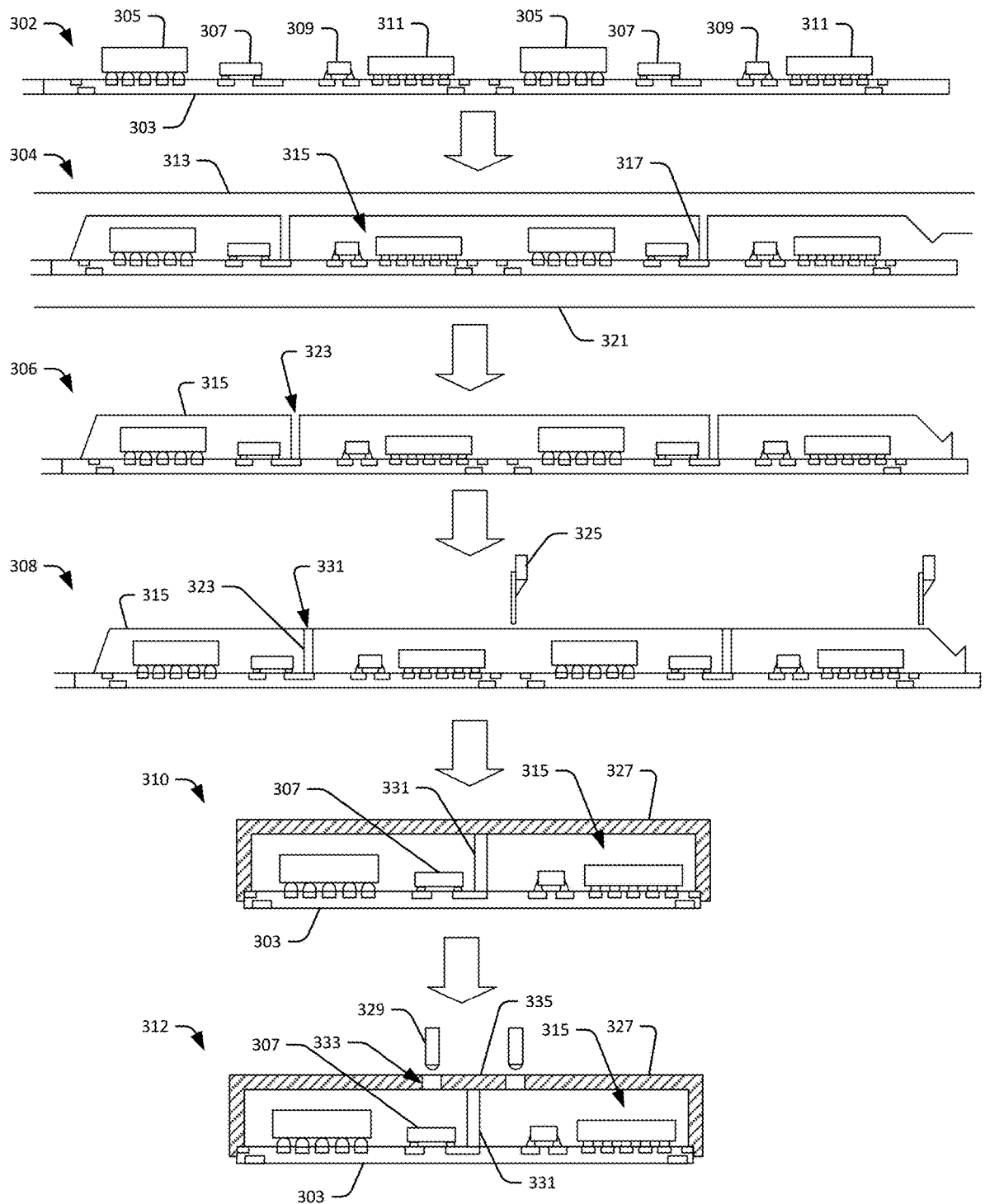
FIG. 3 is a schematic illustration of an example process of forming a system-in-package with a combined EMI shielding and a capacitive sensing pad in accordance with one or more embodiments of the disclosure.

Referring to FIG. 3, a schematic drawing of an exemplary process for forming system-in-packages is illustrated in accordance with one or more embodiments of the disclosure. Example embodiments of the disclosure provide a number of technical features or technical effects. The examples of technical features and/or technical effects of example embodiments of the disclosure are merely illustrative and not exhaustive. Other embodiments may include additional or fewer components.

As shown in FIG. 3, a system-in-package assembly 302 may include a substrate 303 intended to form multiple substrates for distinct system-in-package assemblies may be combined with several of the same components in the same repeating arrangement for the distinct system-in-package assemblies. Substrate 303 may be substantially similar to substrate 122 but may be designed to form multiple distinct substrates with repeating patterns.

Components such as integrated circuit 305, capacitive sensor 307, passive component 309, and flip chip 311, as well as any other components, may be arranged in repeating patterns and/or arrangements on substrate 303. Integrated circuit 305 may be substantially the same as integrated circuit 130. Capacitive sensor 307 may be substantially the same as capacitive sensor 134. Passive component 309 may be substantially the same as passive component 126. Flip chip 311 may be substantially the same as flip chip 132. It is understood that system-in-package assembly 302 may include few or additional components and such components may be arranged in a different order than that shown in FIG. 3.

Upon mounting the components shown in system-in-package assembly 302, upper molding device 313 and lower molding device 321 may be added to form system-in-package assembly 304. Molding device 313 and molding device 321 may surround system-in-package assembly 302 and may be used for injecting molding compound 315. Molding device 313 and molding device 321 may be coupled to each other to fully contain molding compound 315 and may be removed once molding compound 315 has cured or otherwise transitioned from a amorphous compound into a solid.

Upper molding device 313 and/or lower molding device 321 may include one or more channels 317 to form vias in the molding compound 315. Upper molding device 313 and/or lower molding device 321 may further optionally include various structures (e.g., channel 317) to form recessed portions in molding compound 315 such as one or more troughs. Upper molding device 313 and/or lower molding device 321 may also include shapes and designs to guide or facilitate cutting and/or shaping of the system-in-package. It is understood that fewer or additional components may be included in the molding device.

Once the molding compound 315 has cured and/or otherwise achieved sufficient rigidity to support itself, upper molding device 313 and/or lower molding device 321 may be removed, exposing system-in-package assembly 306 which may include the components of system-in-package assembly 302 encapsulated by molding compound 315. As shown in FIG. 3, vias 323 may be formed once channels 317 are removed. The vias may extend to the substrate and/or capacitive sensor.

To complete the system-in-package assembly, the vias 323 and other recessed portions in molding compound 315 (e.g., troughs) may be filled with conductive a conductive material, resulting in system-in-package assembly 308. As explained above, the conductive material 331 may be any well-known conductive material, substance or paste used to fill vias. Upon filling the vias and other recessed portions of molding compound 315 with the conductive material, cutting devices 325 may be used to achieve singulation of system-in-package assembly 308. For example, cutting devices 325 may be a saw blade and/or any other well-known device used for singulation. Singulation may segment the respective systems-in-packages.

Upon performing singulation of system-in-package assembly 308, individual system-in-package 310 may be encapsulated with a coating 327 to serve as EMI shielding. It is understood that coating 327 may be any material having properties suitable for electromagnetic shielding (e.g., stainless steel and/or copper). As shown in FIG. 3, coating 317 may extend to substrate 303 which may include copper traces for grounding. Conductive material 331 may extend between coating 327 and capacitive sensor 307 and/or copper traces in substrate 303 in electrical communication with capacitive sensor 307 and may facilitate electrical communication between capacitive sensor 307 and coating 327.

Coating 327 may be metallic and may be made of one or more thin layers of metallic coating. For example, coating 327 may include an upper layer of stainless steel, a middle layer of copper, and a lower layer of stainless steel. Coating 327 may be deposited over molding compound using sputtering, jetting, and/or any other well-known coating process for depositing one or more thin layers of metallic material. Coating 327 may maintain a constant thickness throughout or may vary in thickness as desired.

To form a sensing pad 335 from coating 327, a portion of the coating 327 may be separated from the rest of the coating 327 grounded to the substrate. For example, a channel 333 may be formed in coating 327 using one or more well-known techniques such as laser technology, applying a chemical compound (e.g., chemical milling or etching), and other well-known mechanical approaches such as milling. After forming the channel 333, molding compound 315 may be exposed and/or may be optionally filled with a non-conductive and/or mask compound. Conductive material 331 may connect sensing pad 335 to capacitive sensor 307. The resulting system-in-package 312 may be encapsulated by EMI shielding (e.g., coating 327) which may incorporate the touch sensing pad, thereby eliminating the need for a touch sensing pad and/or capacitive sensor exterior to the encapsulated system-in-package.

Figure 4A:
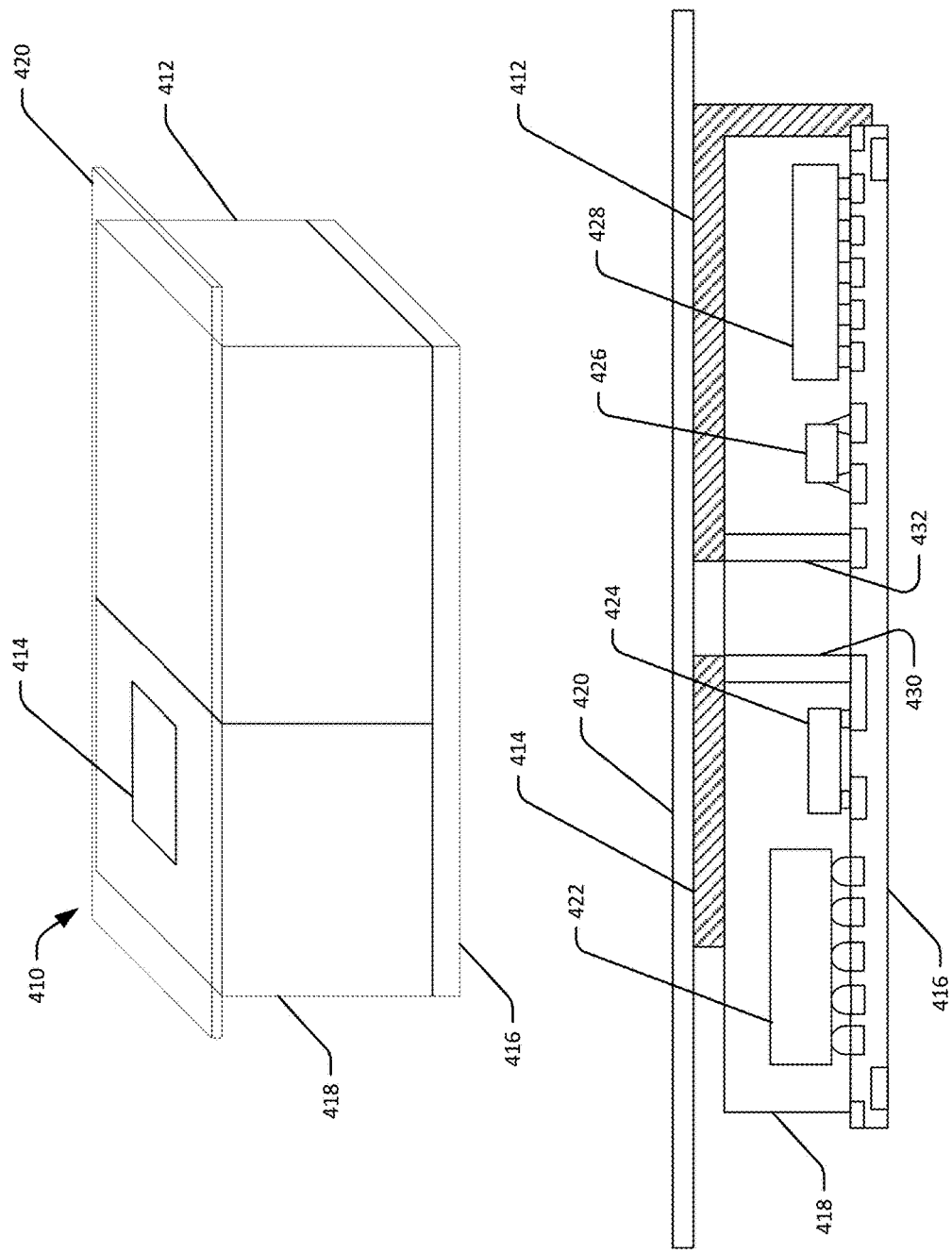
FIGS. 4A and 4B are schematic and perspective illustrations of an example system-in-package with EMI shielding over a portion of the system-in-package forming a capacitive sensing pad in accordance with one or more embodiments of the disclosure.
Figure 4B:
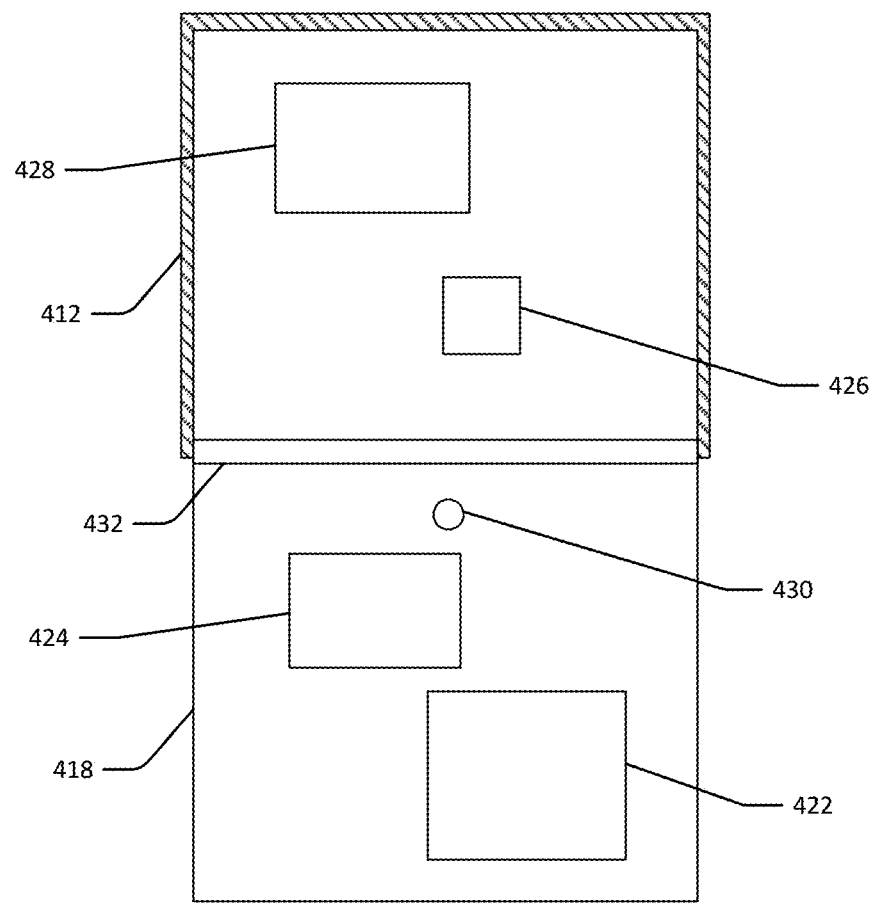

FIGS. 4A-4B illustrate cross-section and perspective views of an example system-in-package device 410 that is partially encapsulated with EMI shielding and includes a touch layer. Example embodiments of the disclosure provide a number of technical features or technical effects. The examples of technical features and/or technical effects of example embodiments of the disclosure are merely illustrative and not exhaustive. Other embodiments may include additional or fewer components.

As shown in FIG. 4A, example system-in-package device 410 may include substrate 416 and molding compound 418 which surrounds components mounted on substrate 416 (e.g., integrated circuit 422, capacitive sensor 424, passive component 426 and/or flip chip 428), which may be partially encapsulated by coating 412 which may be the same as coating 327. Integrated circuit 422 may be the same as integrated circuit 130, capacitive sensor 424 may be the same capacitive sensor 134, passive component 426 may be the same as passive component 126, and flip chip 428 may be the same as flip chip 132.

Substrate 416 may be the same as substrate 303. Molding compound 418 may be exposed where coating 412 is absent. Alternatively, a masking and/or non-conductive compound or material may be deposited where coating 412 is absent. Sensing pad 414 may also be disposed over a portion of molding compound 418. Sensing pad 414 may be the same material as coating 412 and may be deposited at the same time as coating 412. In one example, sensing pad 414 and coating 412 may be the same component and sensing pad 414 may be separated from coating 412 using techniques described above (e.g., laser, chemical compound, machining, milling, etc.). Via 430 filled with a conducive compound may electrically connect sensing pad 414 to capacitive sensor 424. Further, coating 412 may be grounded to substrate 416 (e.g., using copper traces).

To fully surround the components of system-in-package device 410 and protect the components from electromagnetic interference, a tough 432 filled with a conductive material may extend from the end of coating 412 to the substrate 416 to fully surround the components with EMI shielding. In this manner, the trough may form one of four walls used to isolate and shield the components. The trough may be in electrical communication with the substrate 416 as well as coating 412. Partial encapsulation of the system-in-package may be preferable where only some components need shielding from electromagnetic interference. Partial encapsulation may save resources and reduce cost. Touch layer 420 may extend over the coating 412 and may form a touch screen, touch material and/or display screen or the like. It is understood that touch layer 420 may be one or more layers and/or components and may be used to display media content and/or receive touch input. It is further understood that an electrical field may be generated between touch layer 420 and any portion of coating 412 such that capacitive sensor 424 may detect touch input on touch layer 420.

Referring now to FIG. 4B, a top cross-sectional view of the same system-in-package device of FIG. 4A is illustrated. As shown in FIG. 4B, system-in-package device 410 may include substrate 416 (not shown) and molding compound 418 which surrounds integrated circuit 422, capacitive sensor 424, passive component 426 and flip chip 428. Further, via 430 and trough 432 may extend through molding compound 418 to the substrate. Coating 412 may be disposed over a portion of molding compound 418 surrounding flip chip 428 and passive component 426 and may extend to trough 432. It is understood that coating 412 and trough 432 may be used to surround and/or provide EMI shielding for any components of the system-in-package device.

FIGS. 5A-5D illustrate exemplary sensing pad patterns and arrangement for coating encapsulating the system-in-package and forming EMI shielding in accordance with one or more embodiments of the disclosure. Other embodiments may include additional or fewer components, different designs, patterns and/or arrangements.

Figure 5A:
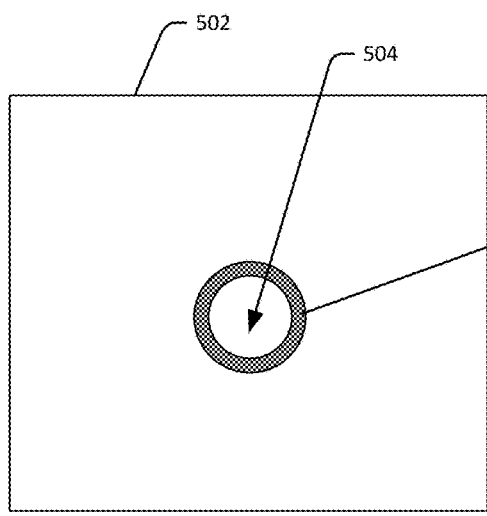
FIGS. 5A-D are a schematic illustrations of exemplary capacitive sensing pad designs in accordance with one or more embodiments of the disclosure.

Referring now to FIG. 5A, a circular sensing pad arrangement is illustrated including coating 502 and sensing pad 504. Coating 502 may be the same as coating 327. This is the same sensing pad arrangement is illustrated in FIG. 1A-B and FIG. 3. As explained above, sensing pad 504 may be created from coating 502 (e.g., using laser, chemical, and machine approaches). Coating 502 may be in electrical communication with the substrate and thereby grounded and sensing pad 504 may be in electrical communication with a sensor (e.g., a capacitive sensor).

In this manner, an electrical field may be generated between sensing pad 504 and coating 502 and the capacitive sensor may detect changes in the electrical field (e.g., due to a finger or stylus coming into electrical communication with sensing pad 504). In one example, sensing pad 504 may be employed to perform on/off functionality. It is understood that channel 503 that separates sensing pad 504 from coating 502 may vary in width. It is further understood that sensing pad 504 may vary in size and shape and even thickness. In one example, sensing pad 504 may adopt a non-circular shape.

Figure 5B:
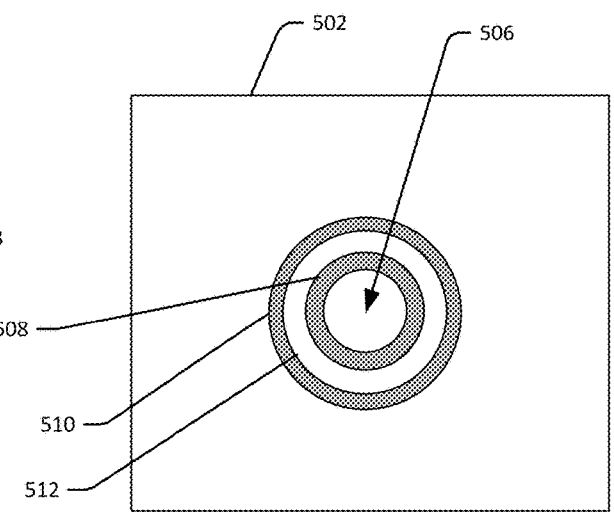

Referring now to FIG. 5B, a two-circle sensing pad arrangement is illustrated including coating 502, sensing pad 506, and sensing pad 512. Channel 508 may separate sensing pad 506 from sensing pad 512 and channel 510 may separate sensing pad 512 from coating 502. Sensing pad 506 and sensing pad 512 may be created from coating 502 (e.g., using laser, chemical, and machine approaches). Coating 502 may be in electrical communication with a substrate and thereby may be grounded and sensing pad 506 and sensing pad 512 may each independently be in electrical communication with a sensor (e.g., a capacitive sensor). For example, sensing pad 506 and sensing pad 512 may electrically connect to different inputs of a capacitive sensor mounted to a substrate (e.g., using separate vias filled with a conductive material).

In this manner, an electrical field may be generated between sensing pad 506, sensing pad 512, and coating 502 and the capacitive sensor may detect changes in the electrical field (e.g., due to a finger or stylus coming into electrical communication with sensing pad 506 and/or sensing pad 512). In one example, sensing pad 506 may be a receiving electrode and sensing pad 512 may be a transmitting electrode, and vice versa. With two sensing pads in this arrangement, the capacitive sensor may employ sensing pad 506 and sensing pad 512 to detect varying degrees of changes in the electrical field (e.g., to perform dimming functionality). This may be referred to as mutual capacitance sensing.

It is understood that channels 510 and 508 that separate sensing pad 512 and coating 502 and sensing pad 506 and sensing pad 512, respectively, may vary in width. It is further understood that sensing pad 506 and/or sensing pad 512 may vary in size and shape and even thickness. In one example, sensing pads 506 and 512 may adopt a non-circular shape. It is further understood that additional concentric rings may be incorporated as sensing pads, which may increase the detectable variance in the electrical field.

Figure 5C:
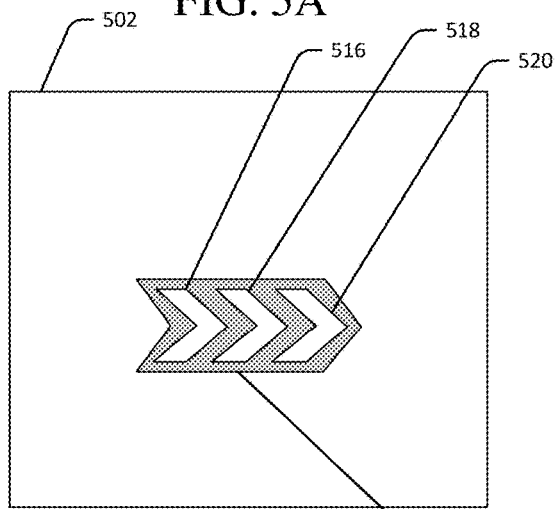

Referring now to FIG. 5C, a multi-arrow sensing pad arrangement is illustrated including coating 502, sensing pad 516, sensing pad 518 and sensing pad 520. Channel 514 may define sensing pad 516, sensing pad 518 and sensing pad 520 and may separate each sensing pad from one another and from coating 502. Sensing pad 516, sensing pad 518 and sensing pad 520 may be created from coating 502 (e.g., using laser, chemical, and machine approaches) and may be arranged in a linear pattern.

Coating 502 may be in electrical communication with a substrate to ground the coating 502 to the substrate (e.g., using copper traces). Sensing pad 516, sensing pad 518 and sensing pad 520 may each independently be in electrical communication with a sensor (e.g., a capacitive sensor). For example, sensing pad 516, sensing pad 518 and sensing pad 520 may each electrically connect to different inputs of a capacitive sensor mounted to a substrate (e.g., using separate vias filled with a conductive material).

In this manner, an electrical field may be generated between sensing pad 516, sensing pad 518 and sensing pad 520, and coating 502 and the capacitive sensor may detect changes in the electrical field (e.g., due to a finger or stylus coming into electrical communication with sensing pad 516, sensing pad 518 and sensing pad 520). With three sensing pads in sequential arrangement, the capacitive sensor may detect directional movement (e.g., in a scrolling and slider motion).

Figure 5D:
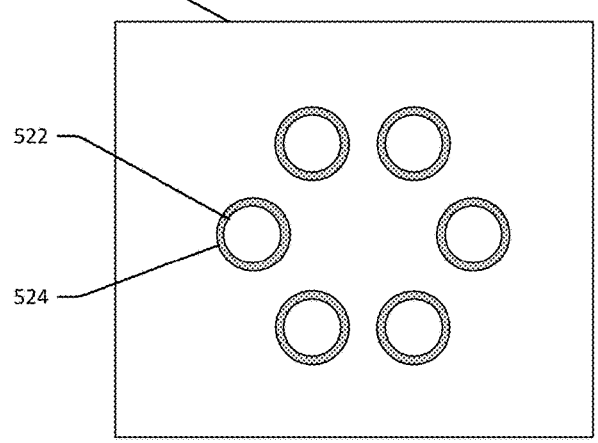

Referring now to FIG. 5D, circular sensing pads in a circular arrangement are illustrated including coating 502, sensing pad 522 and channel 524. A circular channel (e.g., channel 524) may separate a smaller and concentric circular sensing pad (e.g., sensing pad 522) from coating 502. For example, sensing pad 522 may be created from coating 502 (e.g., using laser, chemical, and machine approaches).

Coating 502 may be in electrical communication with a to ground coating 502 to the substrate (e.g., using copper traces). The circular sensing pads, such as sensing pad 522, may each independently be in electrical communication with a sensor (e.g., a capacitive sensor). For example, each sensing pad may each electrically connect to different inputs of a capacitive sensor mounted to a substrate (e.g., using separate vias filled with a conductive material).

In this manner, an electrical field may be generated from the circular sensing pads arranged in the circular pattern such that the capacitive sensor may detect changes in the electrical field (e.g., due to a finger or stylus coming into electrical communication with sensing pad 522 and/or coating 502). With multiple sensing pads arranged in a circular pattern, the capacitive sensor may detect directional movement in the direction of a circle (e.g., swiping in a circular or wheel pattern). In one example, this may be used to increase or decrease volume and/or fast forward or rewind media content.

Example Device Architecture

Figure 6:
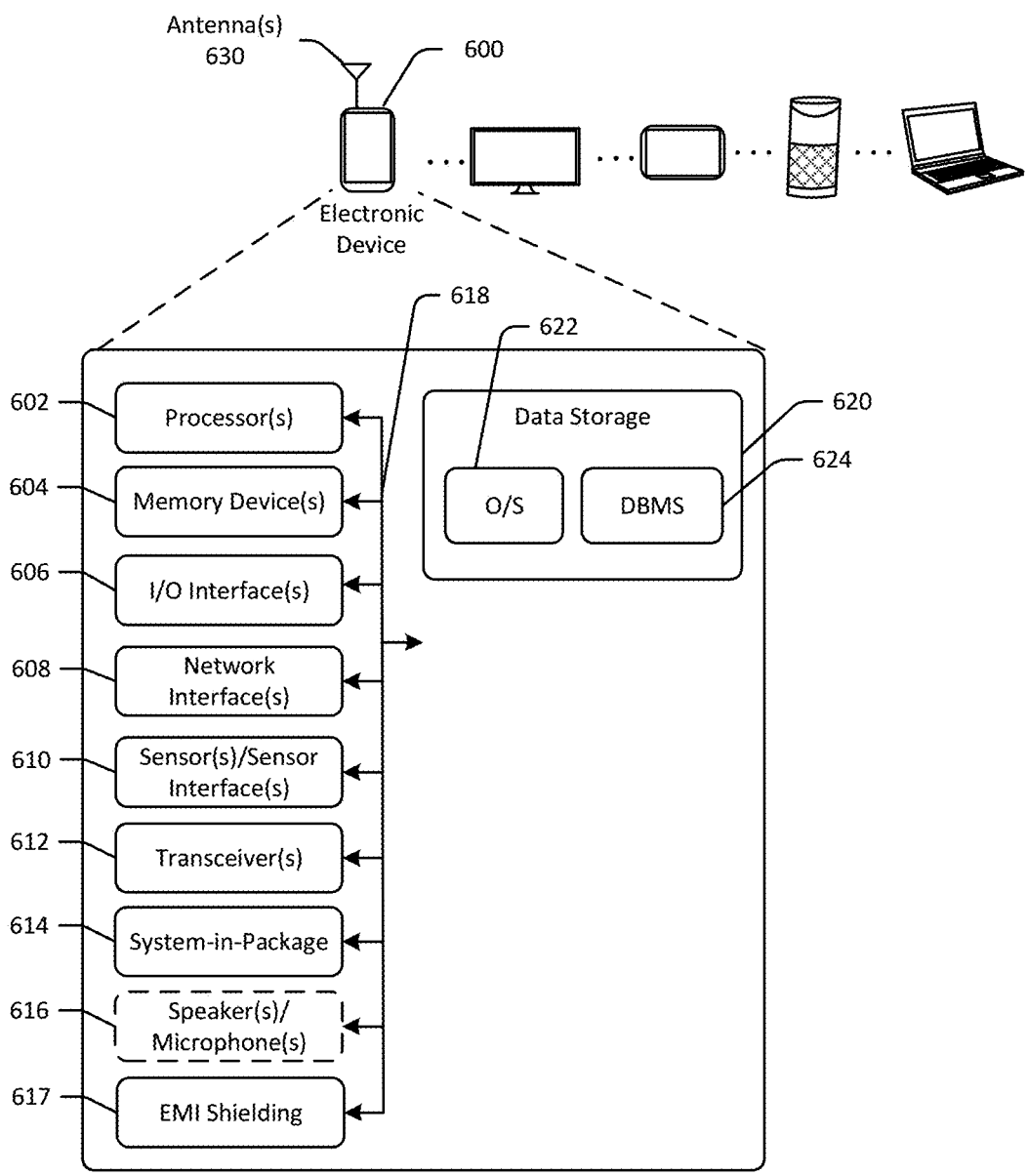
FIG. 6 schematically illustrates an example architecture of an electronic device in accordance with one or more embodiments of the disclosure.

FIG. 6 is a schematic block diagram of one or more illustrative electronic device(s) 600 in accordance with one or more example embodiments of the disclosure. The electronic device(s) 600 may include any suitable battery-operated computing device including, but not limited to a mobile device such as a smartphone, a tablet, an e-reader, a wearable device, or the like; a desktop computer; a laptop computer; a content streaming device, or the like; a server system, a voice interaction device, or the like. The electronic device(s) 600 may correspond to an illustrative device configuration for the device(s) that includes one or more of the system(s)-in-package(s) of FIGS. 1-5D.

The electronic device(s) 600 may be configured to communicate with one or more servers, user devices, or the like. The electronic device(s) 600 may be configured to receive one or more batteries, such as a lithium-ion battery. The electronic device(s) 600 may be configured to use a system(s)-in-package(s) to determine one or more ambient environment characteristics, and/or to output sound, capture audio, capture images, and/or other actions related to an ambient environment of the device.

The electronic device(s) 600 may be configured to communicate via one or more networks. Such network(s) may include, but are not limited to, any one or more different types of communications networks such as, for example, cable networks, public networks (e.g., the Internet), private networks (e.g., frame-relay networks), wireless networks, cellular networks, telephone networks (e.g., a public switched telephone network), or any other suitable private or public packet-switched or circuit-switched networks. Further, such network(s) may have any suitable communication range associated therewith and may include, for example, global networks (e.g., the Internet), metropolitan area networks (MANs), wide area networks (WANs), local area networks (LANs), or personal area networks (PANs). In addition, such network(s) may include communication links and associated networking devices (e.g., link-layer switches, routers, etc.) for transmitting network traffic over any suitable type of medium including, but not limited to, coaxial cable, twisted-pair wire (e.g., twisted-pair copper wire), optical fiber, a hybrid fiber-coaxial (HFC) medium, a microwave medium, a radio frequency communication medium, a satellite communication medium, or any combination thereof.

In an illustrative configuration, the electronic device(s) 600 may include one or more processors (processor(s)) 602, one or more memory devices 604 (also referred to herein as memory 604), one or more input/output (I/O) interface(s) 606, one or more network interface(s) 608, one or more sensor(s) or sensor interface(s) 610 such as a capacitive sensor (e.g., a capacitive touch sensor), one or more transceiver(s) 612, one or more system(s)-in-package(s) 614, one or more optional microphone(s) 616, EMI shielding 617 (e.g., coating), and data storage 620. The electronic device(s) 600 may further include one or more bus(es) 618 that functionally couple various components of the electronic device(s) 600. The electronic device(s) 600 may further include one or more antenna(s) 630 that may include, without limitation, a cellular antenna for transmitting or receiving signals to/from a cellular network infrastructure, an antenna for transmitting or receiving Wi-Fi signals to/from an access point (AP), a Global Navigation Satellite System (GNSS) antenna for receiving GNSS signals from a GNSS satellite, a Bluetooth antenna for transmitting or receiving Bluetooth signals, a Near Field Communication (NFC) antenna for transmitting or receiving NFC signals, and so forth. These various components will be described in more detail hereinafter.

The bus(es) 618 may include at least one of a system bus, a memory bus, an address bus, or a message bus, and may permit the exchange of information (e.g., data (including computer-executable code), signaling, etc.) between various components of the electronic device(s) 600. The bus(es) 618 may include, without limitation, a memory bus or a memory controller, a peripheral bus, an accelerated graphics port, and so forth. The bus(es) 618 may be associated with any suitable bus architecture including, without limitation, an Industry Standard Architecture (ISA), a Micro Channel Architecture (MCA), an Enhanced ISA (EISA), a Video Electronics Standards Association (VESA) architecture, an Accelerated Graphics Port (AGP) architecture, a Peripheral Component Interconnect (PCI) architecture, a PCI-Express architecture, a Personal Computer Memory Card International Association (PCMCIA) architecture, a Universal Serial Bus (USB) architecture, and so forth.

The memory 604 of the electronic device(s) 600 may include volatile memory (memory that maintains its state when supplied with power) such as random access memory (RAM) and/or non-volatile memory (memory that maintains its state even when not supplied with power) such as read-only memory (ROM), flash memory, ferroelectric RAM (FRAM), and so forth. Persistent data storage, as that term is used herein, may include non-volatile memory. In certain example embodiments, volatile memory may enable faster read/write access than non-volatile memory. However, in certain other example embodiments, certain types of non-volatile memory (e.g., FRAM) may enable faster read/write access than certain types of volatile memory.

In various implementations, the memory 604 may include multiple different types of memory such as various types of static random access memory (SRAM), various types of dynamic random access memory (DRAM), various types of unalterable ROM, and/or writeable variants of ROM such as electrically erasable programmable read-only memory (EEPROM), flash memory, and so forth. The memory 604 may include main memory as well as various forms of cache memory such as instruction cache(s), data cache(s), translation lookaside buffer(s) (TLBs), and so forth. Further, cache memory such as a data cache may be a multi-level cache organized as a hierarchy of one or more cache levels (L1, L2, etc.).

The data storage 620 may include removable storage and/or non-removable storage including, but not limited to, magnetic storage, optical disk storage, and/or tape storage. The data storage 620 may provide non-volatile storage of computer-executable instructions and other data. The memory 604 and the data storage 620, removable and/or non-removable, are examples of computer-readable storage media (CRSM) as that term is used herein.

The data storage 620 may store computer-executable code, instructions, or the like that may be loadable into the memory 604 and executable by the processor(s) 602 to cause the processor(s) 602 to perform or initiate various operations. The data storage 620 may additionally store data that may be copied to the memory 604 for use by the processor(s) 602 during the execution of the computer-executable instructions. Moreover, output data generated as a result of execution of the computer-executable instructions by the processor(s) 602 may be stored initially in the memory 604, and may ultimately be copied to the data storage 620 for non-volatile storage.

More specifically, the data storage 620 may store one or more operating systems (O/S) 622; one or more database management systems (DBMS) 624; and one or more program module(s), applications, engines, computer-executable code, scripts, or the like. Some or all of these module(s) may be sub-module(s). Any of the components depicted as being stored in the data storage 620 may include any combination of software, firmware, and/or hardware. The software and/or firmware may include computer-executable code, instructions, or the like that may be loaded into the memory 604 for execution by one or more of the processor(s) 602. Any of the components depicted as being stored in the data storage 620 may support functionality described in reference to corresponding components named earlier in this disclosure.

The data storage 620 may further store various types of data utilized by the components of the electronic device(s) 600. Any data stored in the data storage 620 may be loaded into the memory 604 for use by the processor(s) 602 in executing computer-executable code. In addition, any data depicted as being stored in the data storage 620 may potentially be stored in one or more datastore(s) and may be accessed via the DBMS 624 and loaded in the memory 604 for use by the processor(s) 602 in executing computer-executable code. The datastore(s) may include, but are not limited to, databases (e.g., relational, object-oriented, etc.), file systems, flat files, distributed datastores in which data is stored on more than one node of a computer network, peer-to-peer network datastores, or the like.

The processor(s) 602 may be configured to access the memory 604 and execute the computer-executable instructions loaded therein. For example, the processor(s) 602 may be configured to execute the computer-executable instructions of the various program module(s), applications, engines, or the like of the electronic device(s) 600 to cause or facilitate various operations to be performed in accordance with one or more embodiments of the disclosure. The processor(s) 602 may include any suitable processing unit capable of accepting data as input, processing the input data in accordance with stored computer-executable instructions, and generating output data. The processor(s) 602 may include any type of suitable processing unit including, but not limited to, a central processing unit, a microprocessor, a Reduced Instruction Set Computer (RISC) microprocessor, a Complex Instruction Set Computer (CISC) microprocessor, a microcontroller, an Application Specific Integrated Circuit (ASIC), a Field-Programmable Gate Array (FPGA), a System-on-a-Chip (SoC), a digital signal processor (DSP), and so forth. Further, the processor(s) 602 may have any suitable microarchitecture design that includes any number of constituent components such as, for example, registers, multiplexers, arithmetic logic units, cache controllers for controlling read/write operations to cache memory, branch predictors, or the like. The microarchitecture design of the processor(s) 602 may be capable of supporting any of a variety of instruction sets.

Referring now to other illustrative components depicted as being stored in the data storage 620, the O/S 622 may be loaded from the data storage 620 into the memory 604 and may provide an interface between other application software executing on the electronic device(s) 600 and the hardware resources of the electronic device(s) 600. More specifically, the O/S 622 may include a set of computer-executable instructions for managing the hardware resources of the electronic device(s) 600 and for providing common services to other application programs (e.g., managing memory allocation among various application programs). In certain example embodiments, the O/S 622 may control execution of the other program module(s). The O/S 622 may include any operating system now known or which may be developed in the future including, but not limited to, any server operating system, any mainframe operating system, or any other proprietary or non-proprietary operating system.

The DBMS 624 may be loaded into the memory 604 and may support functionality for accessing, retrieving, storing, and/or manipulating data stored in the memory 604 and/or data stored in the data storage 620. The DBMS 624 may use any of a variety of database models (e.g., relational model, object model, etc.) and may support any of a variety of query languages. The DBMS 624 may access data represented in one or more data schemas and stored in any suitable data repository including, but not limited to, databases (e.g., relational, object-oriented, etc.), file systems, flat files, distributed datastores in which data is stored on more than one node of a computer network, peer-to-peer network datastores, or the like. In those example embodiments in which the electronic device(s) 600 is a mobile device, the DBMS 624 may be any suitable lightweight DBMS optimized for performance on a mobile device.

Referring now to other illustrative components of the electronic device(s) 600, the input/output (I/O) interface(s) 606 may facilitate the receipt of input information by the electronic device(s) 600 from one or more I/O devices as well as the output of information from the electronic device(s) 600 to the one or more I/O devices. The I/O devices may include any of a variety of components such as a display or display screen having a touch surface or touchscreen; an audio output device for producing sound, such as a speaker; an audio capture device, such as a microphone; an image and/or video capture device, such as a camera; a haptic unit; and so forth. Any of these components may be integrated into the electronic device(s) 600 or may be separate. The I/O devices may further include, for example, any number of peripheral devices such as data storage devices, printing devices, and so forth.

The I/O interface(s) 606 may also include an interface for an external peripheral device connection such as universal serial bus (USB), FireWire, Thunderbolt, Ethernet port or other connection protocol that may connect to one or more networks. The I/O interface(s) 606 may also include a connection to one or more of the antenna(s) 630 to connect to one or more networks via a wireless local area network (WLAN) (such as Wi-Fi) radio, Bluetooth, ZigBee, and/or a wireless network radio, such as a radio capable of communication with a wireless communication network such as a Long Term Evolution (LTE) network, WiMAX network, 3G network, a ZigBee network, etc.

The electronic device(s) 600 may further include one or more network interface(s) 608 via which the electronic device(s) 600 may communicate with any of a variety of other systems, platforms, networks, devices, and so forth. The network interface(s) 608 may enable communication, for example, with one or more wireless routers, one or more host servers, one or more web servers, and the like via one or more networks.

The antenna(s) 630 may include any suitable type of antenna depending, for example, on the communications protocols used to transmit or receive signals via the antenna(s) 630. Non-limiting examples of suitable antennas may include directional antennas, non-directional antennas, dipole antennas, folded dipole antennas, patch antennas, multiple-input multiple-output (MIMO) antennas, or the like. The antenna(s) 630 may be communicatively coupled to one or more transceivers 612 or radio components to which or from which signals may be transmitted or received.

As previously described, the antenna(s) 630 may include a cellular antenna configured to transmit or receive signals in accordance with established standards and protocols, such as Global System for Mobile Communications (GSM), 3G standards (e.g., Universal Mobile Telecommunications System (UMTS), Wideband Code Division Multiple Access (W-CDMA), CDMA2000, etc.), 4G standards (e.g., Long-Term Evolution (LTE), WiMax, etc.), direct satellite communications, or the like.

The antenna(s) 630 may additionally, or alternatively, include a Wi-Fi antenna configured to transmit or receive signals in accordance with established standards and protocols, such as the IEEE 802.11 family of standards, including via 2.4 GHz channels (e.g., 802.11b, 802.11g, 802.11n), 5 GHz channels (e.g., 802.11n, 802.11ac), or 60 GHz channels (e.g., 802.11ad). In alternative example embodiments, the antenna(s) 630 may be configured to transmit or receive radio frequency signals within any suitable frequency range forming part of the unlicensed portion of the radio spectrum.

The antenna(s) 630 may additionally, or alternatively, include a GNSS antenna configured to receive GNSS signals from three or more GNSS satellites carrying time-position information to triangulate a position therefrom. Such a GNSS antenna may be configured to receive GNSS signals from any current or planned GNSS such as, for example, the Global Positioning System (GPS), the GLONASS System, the Compass Navigation System, the Galileo System, or the Indian Regional Navigational System.

The transceiver(s) 612 may include any suitable radio component(s) for—in cooperation with the antenna(s) 630—transmitting or receiving radio frequency (RF) signals in the bandwidth and/or channels corresponding to the communications protocols utilized by the electronic device(s) 600 to communicate with other devices. The transceiver(s) 612 may include hardware, software, and/or firmware for modulating, transmitting, or receiving—potentially in cooperation with any of antenna(s) 630—communications signals according to any of the communications protocols discussed above including, but not limited to, one or more Wi-Fi and/or Wi-Fi direct protocols, as standardized by the IEEE 802.11 standards, one or more non-Wi-Fi protocols, or one or more cellular communications protocols or standards. The transceiver(s) 612 may further include hardware, firmware, or software for receiving GNSS signals. The transceiver(s) 612 may include any known receiver and baseband suitable for communicating via the communications protocols utilized by the electronic device(s) 600. The transceiver(s) 612 may further include a low noise amplifier (LNA), additional signal amplifiers, an analog-to-digital (A/D) converter, one or more buffers, a digital baseband, or the like.

The sensor(s)/sensor interface(s) 610 may include or may be capable of interfacing with any suitable type of sensing device such as, for example, inertial sensors, force sensors, thermal sensors, photocells, and so forth. Example types of inertial sensors may include accelerometers (e.g., MEMS-based accelerometers), gyroscopes, and so forth. It is understood that sensor 610 may be one or more capacitive sensors that may be in electrical communication with a portion of EMI shielding 617 that forms a sensing pad. The system(s)-in-package(s) 614 may be any of the system(s)-in-package(s) described herein, and may include sensor(s) configured to detect variances in an electrical field in the EMI shielding to detect touch. The system(s)-in-package(s) 614 may be coupled to a battery or other components, such as those described in conjunction with FIGS. 1-5D. The optional speaker(s)/microphone(s) 616 may be any device configured to receive analog sound input or voice data.

It should be appreciated that the program module(s), applications, computer-executable instructions, code, or the like depicted in FIG. 6 as being stored in the data storage 620 are merely illustrative and not exhaustive and that processing described as being supported by any particular module may alternatively be distributed across multiple module(s) or performed by a different module. In addition, various program module(s), script(s), plug-in(s), Application Programming Interface(s) (API(s)), or any other suitable computer-executable code hosted locally on the electronic device(s) 600, and/or hosted on other computing device(s) accessible via one or more networks, may be provided to support functionality provided by the program module(s), applications, or computer-executable code depicted in FIG. 6 and/or additional or alternate functionality. Further, functionality may be modularized differently such that processing described as being supported collectively by the collection of program module(s) depicted in FIG. 6 may be performed by a fewer or greater number of module(s), or functionality described as being supported by any particular module may be supported, at least in part, by another module. In addition, program module(s) that support the functionality described herein may form part of one or more applications executable across any number of systems or devices in accordance with any suitable computing model such as, for example, a client-server model, a peer-to-peer model, and so forth. In addition, any of the functionality described as being supported by any of the program module(s) depicted in FIG. 6 may be implemented, at least partially, in hardware and/or firmware across any number of devices.

It should further be appreciated that the electronic device(s) 600 may include alternate and/or additional hardware, software, or firmware components beyond those described or depicted without departing from the scope of the disclosure. More particularly, it should be appreciated that software, firmware, or hardware components depicted as forming part of the electronic device(s) 600 are merely illustrative and that some components may not be present or additional components may be provided in various embodiments. While various illustrative program module(s) have been depicted and described as software module(s) stored in the data storage 620, it should be appreciated that functionality described as being supported by the program module(s) may be enabled by any combination of hardware, software, and/or firmware. It should further be appreciated that each of the above-mentioned module(s) may, in various embodiments, represent a logical partitioning of supported functionality. This logical partitioning is depicted for ease of explanation of the functionality and may not be representative of the structure of software, hardware, and/or firmware for implementing the functionality. Accordingly, it should be appreciated that functionality described as being provided by a particular module may, in various embodiments, be provided at least in part by one or more other module(s). Further, one or more depicted module(s) may not be present in certain embodiments, while in other embodiments, additional module(s) not depicted may be present and may support at least a portion of the described functionality and/or additional functionality. Moreover, while certain module(s) may be depicted and described as sub-module(s) of another module, in certain embodiments, such module(s) may be provided as independent module(s) or as sub-module(s) of other module(s).

One or more operations of the methods, process flows, and use cases of FIGS. 1-5D may be performed by a device having the illustrative configuration depicted in FIG. 6, or more specifically, by one or more engines, program module(s), applications, or the like executable on such a device. It should be appreciated, however, that such operations may be implemented in connection with numerous other device configurations.

The operations described and depicted in the illustrative methods and process flows of any of FIGS. 1-5D may be carried out or performed in any suitable order as desired in various example embodiments of the disclosure. Additionally, in certain example embodiments, at least a portion of the operations may be carried out in parallel. Furthermore, in certain example embodiments, less, more, or different operations than those depicted in FIGS. 1-5D may be performed.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure.

Certain aspects of the disclosure are described above with reference to block and flow diagrams of systems, methods, apparatuses, and/or computer program products according to example embodiments. It will be understood that one or more blocks of the block diagrams and flow diagrams, and combinations of blocks in the block diagrams and the flow diagrams, respectively, may be implemented by execution of computer-executable program instructions. Likewise, some blocks of the block diagrams and flow diagrams may not necessarily need to be performed in the order presented, or may not necessarily need to be performed at all, according to some embodiments. Further, additional components and/or operations beyond those depicted in blocks of the block and/or flow diagrams may be present in certain embodiments.

Accordingly, blocks of the block diagrams and flow diagrams support combinations of means for performing the specified functions, combinations of elements or steps for performing the specified functions, and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

Program module(s), applications, or the like disclosed herein may include one or more software components including, for example, software objects, methods, data structures, or the like. Each such software component may include computer-executable instructions that, responsive to execution, cause at least a portion of the functionality described herein (e.g., one or more operations of the illustrative methods described herein) to be performed.

A software component may be coded in any of a variety of programming languages. An illustrative programming language may be a lower-level programming language such as an assembly language associated with a particular hardware architecture and/or operating system platform. A software component comprising assembly language instructions may require conversion into executable machine code by an assembler prior to execution by the hardware architecture and/or platform.

Another example programming language may be a higher-level programming language that may be portable across multiple architectures. A software component comprising higher-level programming language instructions may require conversion to an intermediate representation by an interpreter or a compiler prior to execution.

Other examples of programming languages include, but are not limited to, a macro language, a shell or command language, a job control language, a script language, a database query or search language, or a report writing language. In one or more example embodiments, a software component comprising instructions in one of the foregoing examples of programming languages may be executed directly by an operating system or other software component without having to be first transformed into another form.

A software component may be stored as a file or other data storage construct. Software components of a similar type or functionally related may be stored together such as, for example, in a particular directory, folder, or library. Software components may be static (e.g., pre-established or fixed) or dynamic (e.g., created or modified at the time of execution).

Software components may invoke or be invoked by other software components through any of a wide variety of mechanisms. Invoked or invoking software components may comprise other custom-developed application software, operating system functionality (e.g., device drivers, data storage (e.g., file management) routines, other common routines and services, etc.), or third-party software components (e.g., middleware, encryption, or other security software, database management software, file transfer or other network communication software, mathematical or statistical software, image processing software, and format translation software).

Software components associated with a particular solution or system may reside and be executed on a single platform or may be distributed across multiple platforms. The multiple platforms may be associated with more than one hardware vendor, underlying chip technology, or operating system. Furthermore, software components associated with a particular solution or system may be initially written in one or more programming languages, but may invoke software components written in another programming language.

Computer-executable program instructions may be loaded onto a special-purpose computer or other particular machine, a processor, or other programmable data processing apparatus to produce a particular machine, such that execution of the instructions on the computer, processor, or other programmable data processing apparatus causes one or more functions or operations specified in the flow diagrams to be performed. These computer program instructions may also be stored in a computer-readable storage medium (CRSM) that upon execution may direct a computer or other programmable data processing apparatus to function in a particular manner, such that the instructions stored in the computer-readable storage medium produce an article of manufacture including instruction means that implement one or more functions or operations specified in the flow diagrams. The computer program instructions may also be loaded onto a computer or other programmable data processing apparatus to cause a series of operational elements or steps to be performed on the computer or other programmable apparatus to produce a computer-implemented process.

Additional types of CRSM that may be present in any of the devices described herein may include, but are not limited to, programmable random access memory (PRAM), SRAM, DRAM, RAM, ROM, electrically erasable programmable read-only memory (EEPROM), flash memory or other memory technology, compact disc read-only memory (CD-ROM), digital versatile disc (DVD) or other optical storage, magnetic cassettes, magnetic tape, magnetic disk storage or other magnetic storage devices, or any other medium which can be used to store the information and which can be accessed. Combinations of any of the above are also included within the scope of CRSM. Alternatively, computer-readable communication media (CRCM) may include computer-readable instructions, program module(s), or other data transmitted within a data signal, such as a carrier wave, or other transmission. However, as used herein, CRSM does not include CRCM.

Although embodiments have been described in language specific to structural features and/or methodological acts, it is to be understood that the disclosure is not necessarily limited to the specific features or acts described. Rather, the specific features and acts are disclosed as illustrative forms of implementing the embodiments. Conditional language, such as, among others, "can," "could," "might," or "may," unless specifically stated otherwise, or otherwise understood within the context as used, is generally intended to convey that certain embodiments could include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

That which is claimed is:

1. A system-in-package (SiP) comprising:
a substrate;
an integrated circuit disposed on the substrate;
a capacitive touch sensor disposed on the substrate;
one or more additional components disposed on the substrate; and
a molding compound disposed over the integrated circuit, capacitive touch sensor, and the one or more additional components, the molding compound defining a via aligned with the capacitive touch sensor;
a conductive material disposed within the via, the conductive material in electrical communication with the capacitive touch sensor;
a conductive layer disposed over the molding compound, the conductive layer in electrical communication with a portion of the substrate and the conductive material, the conductive layer including a first portion in electrical communication with the conductive material and a second portion in electrical communication with the portion of the substrate; and a recessed region extending through the conductive layer and separating the first portion from the second portion;

wherein the first and second portions generate an electrical field; and wherein the conductive layer is an electromagnetic interference (EMI) shield and is configured to detect a touch input in conjunction with the sensor.

2. The SiP of claim 1, wherein:

the capacitive touch sensor is configured to detect a change in the electrical field generated at the first portion and the second portion in response to touch input.

3. A system comprising:

a substrate;

a sensor disposed on the substrate;

an integrated circuit disposed on the substrate;

a molding compound disposed over the sensor and the integrated circuit;

a conductive layer disposed over the molding compound and in electrical communication with the substrate and the sensor, a first recessed region extending through the conductive layer and separating the conductive layer into a first portion and a second portion; and a second recessed region extending through the conductive layer and separating the first portion from a third portion of the conductive layer;

wherein the conductive layer is configured to (i) reduce electromagnetic interference (EMI) and (ii) detect a touch input in conjunction with the sensor.

4. The system of claim 3 further comprising:

a first via extending through the molding compound to the substrate; and a first conductive material disposed in the first via, the first conductive material in electrical communication with the sensor and the conductive layer.

5. The system of claim 3, wherein the sensor is a capacitive sensor configured to detect a change in an electrical field, the capacitive sensor configured to detect the electrical field generated at the first, the second, and the third portions.

6. The system of claim 3 further comprising:

a first via extending through the molding compound to the substrate; and a second via extending through the molding compound to the substrate, wherein the first via is aligned with the second portion and the second via is aligned with the third portion.

7. The system of claim 3, wherein the second portion of the conductive layer serves as a first electrode and the third portion of the conductive layer serves as a second electrode.

8. The system of claim 3, further comprising:

a trough extending through a width of the molding compound; and a second conductive material disposed within the trough and in electrical communication with the conductive layer and the substrate.

9. The system of claim 8, wherein the conductive layer is only disposed over a portion the molding compound and is electrical communication with a second conductive material such that the conductive layer and the second conductive material reduce electromagnetic interference (EMI).

10. The device of claim 3, wherein the conductive layer includes two or more touch pads arranged in a linear fashion.

11. A system-in-package (SiP) comprising:

a substrate;

a first integrated circuit (IC) mounted on the substrate, wherein the first IC is a capacitive touch sensor;

a second integrated circuit mounted on the substrate;

a molding compound encapsulating the first and the second integrated circuits; and a conductive layer disposed over a top surface of the molding compound and in electrical communication with the substrate and the first IC;

a first recessed region extending through the conductive layer and separating the conductive layer into a first portion and a second portion; and a second recessed region extending through the conductive layer and separating the first portion from a third portion of the conductive layer;

wherein the conductive layer is configured to (i) reduce electromagnetic interference (EMI) and (ii) detect a touch input in conjunction with the first IC.

12. The SiP of claim 11 further comprising:

a first via extending from the top surface of the molding compound to the substrate; and a first conductive material disposed in the first via, the first conductive material in electrical communication with the first IC and the conductive layer.

13. The SiP of claim 11, wherein the second portion of the conductive layer serves as a receiving electrode and the third portion of the conductive layer serves as transmitting electrode.

14. The SiP of claim 11, wherein the first IC is configured to detect an electrical field generated at the first, the second, and the third portions.

15. The SiP of claim 11, wherein the conductive layer includes two or more touch pads arranged in a linear fashion.

16. The SiP pf claim 11 further comprising:

a trough extending through a width of the molding compound; and a second conductive material disposed within the trough and in electrical communication with the conductive layer and the substrate.

* * * * *